United States Patent
Han et al.

(10) Patent No.: US 10,193,060 B2
(45) Date of Patent: Jan. 29, 2019

(54) MAGNETORESISTIVE RANDOM ACCESS MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Yoon-Sung Han, Seoul (KR); Ki-Seok Suh, Hwaseong-si (KR); Woo-Jin Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/449,538

(22) Filed: Mar. 3, 2017

(65) Prior Publication Data
US 2018/0040813 A1    Feb. 8, 2018

(30) Foreign Application Priority Data

Aug. 2, 2016    (KR) .................. 10-2016-0098554

(51) Int. Cl.
*H01L 43/08*    (2006.01)
*H01L 27/22*    (2006.01)
*H01L 43/02*    (2006.01)
*H01L 43/10*    (2006.01)
*H01L 43/12*    (2006.01)

(52) U.S. Cl.
CPC ............ *H01L 43/08* (2013.01); *H01L 27/228* (2013.01); *H01L 43/02* (2013.01); *H01L 43/10* (2013.01); *H01L 43/12* (2013.01)

(58) Field of Classification Search
CPC .............. H01L 27/115; H01L 27/2436; H01L 27/2409; H01L 45/16; H01L 45/144; H01L 45/1233; H01L 45/06; H01L 45/126; H01L 27/11521
See application file for complete search history.

(56) References Cited

U.S. PATENT DOCUMENTS

| | | | |
|---|---|---|---|
| 8,283,186 B2 | 10/2012 | Kim | |
| 8,501,623 B2 | 8/2013 | Oh et al. | |
| 8,524,511 B1* | 9/2013 | Zhong | ..................... H01L 43/12 257/421 |
| 8,866,242 B2 | 10/2014 | Li et al. | |
| 2008/0185670 A1* | 8/2008 | Kajiyama | .............. B82Y 10/00 257/421 |

(Continued)

FOREIGN PATENT DOCUMENTS

KR    10-2005-0080941 A    8/2005

*Primary Examiner* — Mohammed R Alam
(74) *Attorney, Agent, or Firm* — Lee & Morse, P.C.

(57) ABSTRACT

An MRAM device may include an insulating interlayer structure, a lower electrode contact structure and a variable resistance structure. The insulating interlayer may be formed on a substrate. The lower electrode contact structure may extend through the insulating interlayer. The lower electrode contact structure may include a first electrode having a pillar shape and a second electrode having a cylindrical shape on the first electrode. An upper surface of the second electrode may have a ring shape. A variable resistance structure may be formed on the second electrode. The variable resistance structure may include a lower electrode, a magnetic tunnel junction (MTJ) structure and an upper electrode sequentially stacked.

8 Claims, 25 Drawing Sheets

(56) References Cited

U.S. PATENT DOCUMENTS

| | | | |
|---|---|---|---|
| 2008/0315174 A1* | 12/2008 | Kang | H01L 27/115 257/4 |
| 2010/0003767 A1 | 1/2010 | Cho | |
| 2010/0301480 A1* | 12/2010 | Choi | H01L 27/228 257/751 |
| 2011/0121417 A1* | 5/2011 | Li | H01L 43/12 257/421 |
| 2014/0131649 A1* | 5/2014 | Daibou | H01L 43/08 257/2 |
| 2015/0014801 A1 | 1/2015 | Satoh et al. | |
| 2016/0035976 A1 | 2/2016 | Mikawa et al. | |

* cited by examiner

MAGNETORESISTIVE RANDOM ACCESS MEMORY DEVICE AND METHOD OF MANUFACTURING THE SAME

CROSS-REFERENCE TO RELATED APPLICATION

Korean Patent Application No. 10-2016-0098554, filed on Aug. 2, 2016, in the Korean Intellectual Property Office, and entitled: "Magnetoresistive Random Access Memory Device and Method of Manufacturing the Same," is incorporated by reference herein in its entirety.

BACKGROUND

1. Field

Example embodiments relate to semiconductor devices and methods of manufacturing the same. More particularly, example embodiments relate to magnetoresistive random access memory (MRAM) devices and methods of manufacturing the same.

2. Description of the Related Art

When an MRAM device is manufactured, a magnetic tunnel junction (MTJ) layer may be etched by a physical etching process to form an MTJ structure. During the physical etching process, other conductive layers in the MTJ layer may be also etched together with the MTJ layer. Thus, elements of the etched conductive layers may be re-deposited on a sidewall of the MTJ structure, which may generate an electrical short.

SUMMARY

According to example embodiments, there is provided an MRAM device. The MRAM device may include an insulating interlayer structure, a first electrode, a second electrode, an insulation pattern and a variable resistance structure. An insulating interlayer may be formed on a substrate, and the insulating interlayer may include an opening therethrough. The first electrode may be formed in a lower portion of the opening, and the first electrode may have a pillar shape. The second electrode may be formed on a sidewall of the opening, and the second electrode may contact an edge portion of the first electrode and may vertically protrude from an upper surface of the first electrode. An upper surface of the second electrode may have a ring shape. The insulation pattern may be formed on the second electrode, and the insulation pattern may fill an upper portion of the opening. The variable resistance structure may be formed on the second electrode and the insulation pattern. The variable resistance structure may include a lower electrode, a magnetic tunnel junction (MTJ) structure and an upper electrode sequentially stacked.

According to example embodiments, there is provided an MRAM device. The MRAM device may include an insulating interlayer structure, a lower electrode contact structure and a variable resistance structure. The insulating interlayer may be formed on a substrate. The lower electrode contact structure may extend through the insulating interlayer. The lower electrode contact structure may include a first electrode having a pillar shape and a second electrode having a cylindrical shape on the first electrode. An upper surface of the second electrode may have a ring shape. A variable resistance structure may be formed on the second electrode. The variable resistance structure may include a lower electrode, a magnetic tunnel junction (MTJ) structure and an upper electrode sequentially stacked.

According to example embodiments, there is provided an MRAM device. The MRAM device may include an insulating interlayer on a substrate, a lower electrode contact structure, and a variable resistance structure. The lower electrode contact structure may extend through the insulating interlayer. The lower electrode contact structure may include a first electrode having a solid shape and a second electrode, stacked on the first electrode in a first direction. The second electrode may include side surfaces that extend along the first direction and are spaced apart along a second direction, orthogonal to the first direction, by an inner space. The inner space may overlap the first electrode in the first direction and the side surfaces may extend along the second direction further than the first electrode. The variable resistance structure may be on the second electrode. The variable resistance structure may include a lower electrode, a magnetic tunnel junction (MTJ) structure, and an upper electrode sequentially stacked along the first direction.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
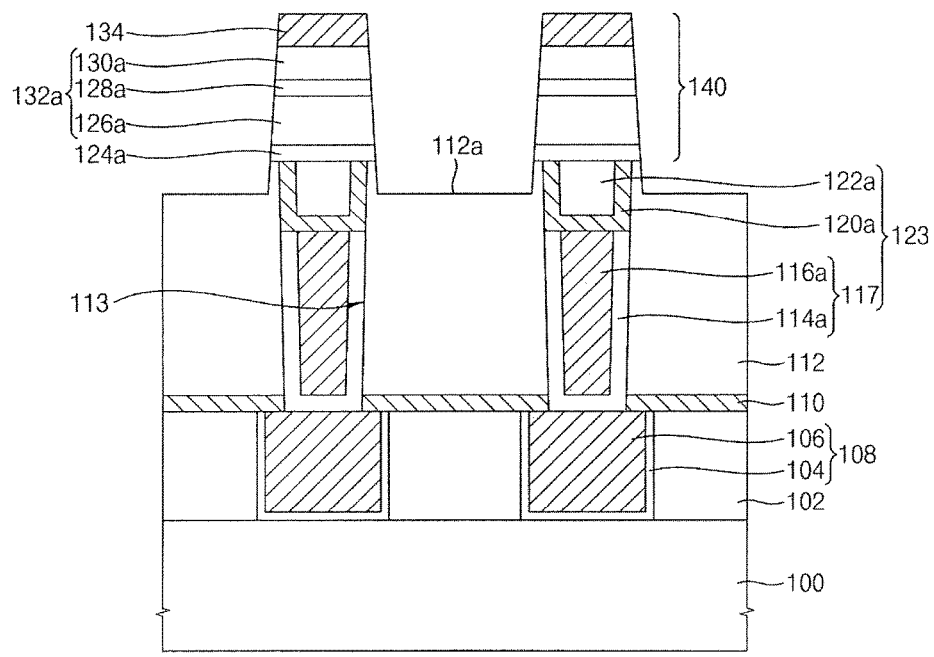
FIG. 1 illustrates a cross-sectional view of an MRAM device in accordance with example embodiments.
Figure 1:
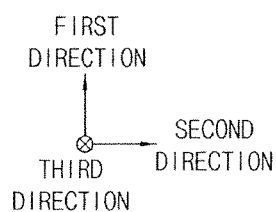
Figure 2:
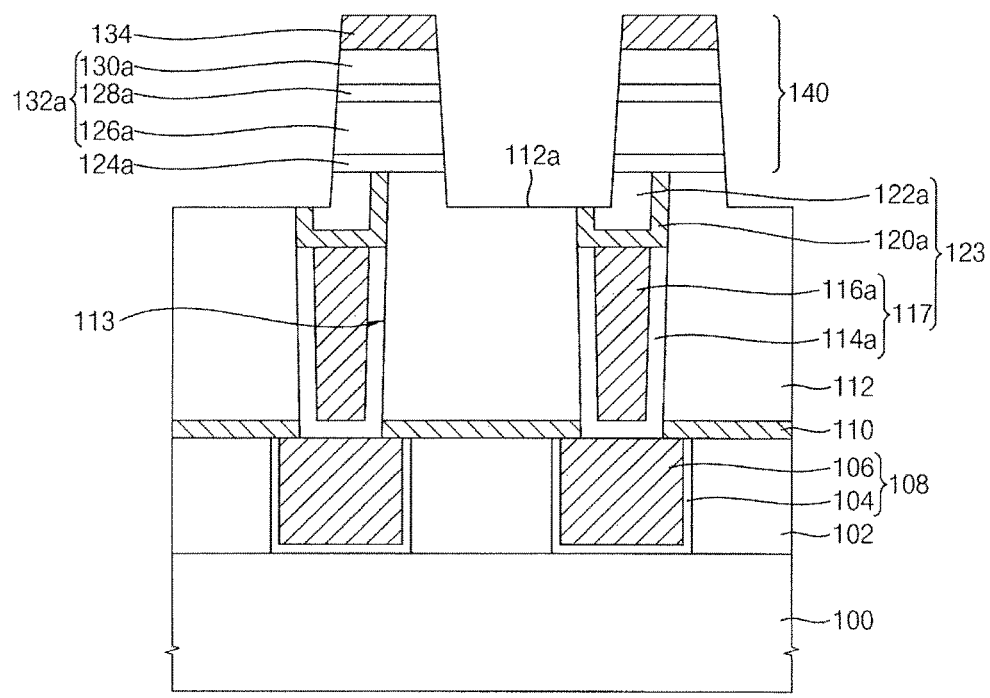
FIG. 2 illustrates a cross-sectional view of an MRAM device in accordance with example embodiments.

FIG. 1 is a cross-sectional view illustrating an MRAM device in accordance with example embodiments. FIG. 2 is a cross-sectional view illustrating an MRAM device in accordance with example embodiments.

The MRAM device shown in FIG. 1 may be substantially the same as the MRAM device shown in FIG. 2, except for the position of a variable resistance structure. In the MRAM device shown in FIG. 1, the variable resistance structure may cover an entire upper surface of a lower electrode contact structure. However, in the MRAM device shown in FIG. 2, the variable resistance structure may partially cover an upper surface of the lower electrode contact structure.

Referring to FIGS. 1 and 2, the MRAM device may include a first insulating interlayer 102, a first wiring structure 108, a second insulating interlayer 112, a lower electrode contact structure 123, a lower electrode 124a, an MTJ structure 132a and an upper electrode 134 stacked in a stacking or first direction on a substrate 100.

The substrate 100 may include a semiconductor material, e.g., silicon, germanium, silicon-germanium, or III-V semiconductor compounds, e.g., gallium phosphide (GaP), gallium arsenide (GaAs), gallium antimonide (GaSb), etc. In an example embodiment, the substrate 100 may be a silicon-on-insulator (SOI) substrate or a germanium-on-insulator (GOI) substrate.

Various types of elements, e.g., word lines, transistors, diodes, source/drain regions, source lines, contact plugs, wirings, etc., and an insulating interlayer covering the elements, may be further formed on the substrate 100.

The first insulating interlayer 102 may include silicon oxide, or a low-k dielectric material having a dielectric constant less than that of silicon oxide, i.e., less than about 3.9. For example, the first insulating interlayer 102 may include silicon oxide doped with carbon (SiCOH) or silicon oxide doped with fluorine (F—SiO$_2$), a porous silicon oxide, spin on organic polymer, or an inorganic polymer, e.g., hydrogen silsesquioxane (HSSQ), methyl silsesquioxane (MSSQ), etc.

The first wiring structure 108 may include a contact plug or a conductive line that extends along the first direction through the first insulating interlayer 102. Upper surfaces of the first insulating interlayer 102 and the first wiring structure 108 may be coplanar with each other, e.g., may extend along the first direction to a same height.

The first wiring structure 108 may include a barrier layer 104 and a metal pattern 106. The barrier layer 104 may cover a sidewall and a bottom of the metal pattern 106, e.g., may be between the metal pattern 106 and the substrate 100 and may be between the metal pattern 106 and the first insulating interlayer 102. The barrier layer 104 may include a metal nitride, e.g., tantalum nitride, titanium nitride, etc., or a metal, e.g., tantalum, titanium, etc. The metal pattern 106 may include, e.g., tungsten, copper, aluminum, etc. Upper surfaces of the first insulating interlayer 102 and the first wiring structure 108 may be coplanar with each other.

An etch stop layer 110 may be formed on the first insulating interlayer 102 and the first wiring structure 108. The etch stop layer 110 may include a nitride, e.g., silicon nitride(SiN), silicon oxynitride(SiON), silicon carbonitride (SiCN), silicon oxycarbonitride(SiOCN), etc., The second insulating interlayer 112 may include, e.g., silicon oxide. For example, the second insulating interlayer 112 may include tetraethyl orthosilicate (TEOS).

The lower electrode contact structure 123 may extend along the first direction through the second insulating interlayer 112 and the etch stop layer 110, and may contact the first wiring structure 108. That is, the lower electrode contact structure 123 may fill a first opening 113 through the second insulating interlayer 112 and the etch stop layer 110.

The lower electrode contact structure 123 may include a first electrode 117, a second electrode 120a, and an insulation pattern 122a. The first electrode 117 may fill a lower portion of the first opening 113, and may have a pillar shape. The first electrode 117 may include a first barrier pattern 114a and a first conductive pattern 116a.

The first barrier pattern 114a may be formed on a bottom and a sidewall of the first opening 113, and thus may cover a sidewall and a bottom of the first electrode. Thus, the first barrier pattern 114a may have a cylindrical shape and an upper surface of the first barrier pattern 114a may have a ring shape. The first barrier pattern 114a may include a metal nitride, e.g., tungsten nitride, tantalum nitride, titanium nitride, etc., or a metal, e.g., tantalum, titanium, etc. The first conductive pattern 116a may be formed on the first barrier pattern 114a, and may have a pillar shape. The first conductive pattern 116a may include a metal, e.g., tungsten, copper, aluminum, etc. For example, the first barrier pattern 114a may include tungsten nitride, and the first conductive pattern 116a may include tungsten.

In example embodiments, the first conductive pattern 116a in the first electrode 117 may have a resistance lower than that of the second electrode 120a. The first conductive pattern 116a may have the pillar shape, so that the first conductive pattern 116a may have a volume greater than volumes of other elements in the lower electrode contact structure 123. Thus, a resistance of the lower electrode contact structure 123 may decrease. In example embodiments, a length of the first electrode 117 from a bottom to top thereof may be greater than a length of the second electrode 120a from a bottom to top thereof, e.g., along the first direction, so that the resistance of the lower electrode contact structure 123 may decrease.

The second electrode 120a may be formed in an upper portion of the first opening 113. The second electrode 120a may be conformally formed on an upper sidewall of the first opening 113 and an upper surface of the first electrode 117, so that the second electrode 120a may have a cylindrical shape, e.g., a hollow cylindrical structure on sidewalls of the first opening 113 with an inner space defined by side surfaces of the second electrode 120a extending in the first direction and a bottom surface of the second electrode 120a extending between the side surfaces along a second direction and overlapping the first electrode 117 in a center thereof. Thus, an upper surface of the second electrode 120a may have a ring shape, e.g., surrounding the inner space of the hollow cylindrical shape, thereby having a smaller upper surface area than that of the first electrode 117. Further, the side surfaces of the second electrode 120a may extend further along the second direction than the first conductive pattern 116a, e.g., may extend as far as the first barrier pattern 114a, and the inner space may overlap the first conductive pattern 116a in the first direction.

In example embodiments, the second electrode 120a may include a material different from a material of the first conductive pattern 116a. In comparison with the first conductive pattern 116a, the second electrode 120a may include a material that may be hardly etched by a physical etching process, e.g., an ion beam etching (IBE) process, such that re-deposition of the material is reduced or minimized. In example embodiments, the second electrode 120a may include a metal nitride. e.g., tungsten nitride, tantalum nitride, titanium nitride, etc., or a metal, e.g., tantalum, titanium, etc.

The insulation pattern 122a may be formed on the second electrode 120a, and may fill the inner space defined by the second electrode 120a. That is, the insulation pattern 122a may fill an upper portion of the first opening 113, e.g., may be a pillar. The insulation pattern 122a may include, e.g., silicon oxide or silicon nitride.

The lower electrode 124a, the MTJ structure 132a and the upper electrode 134 sequentially stacked along the first direction may form a variable resistance structure 140. The variable resistance structure 140 may be formed on the lower electrode contact structure 123 and the second insulating interlayer 112. In example embodiments, the lower surface of the variable resistance structure 140 may have an area greater than that of an upper surface of the variable resistance structure 140, e.g., a surface area in the second direction and a third direction may gradually decrease from the lower electrode 124a to the upper electrode 134 along the first direction. The second and third directions may be substantially perpendicular to each other. The second and third directions may be substantially parallel to a top surface of the substrate.

The variable resistance structure 140 may contact at least a portion of the upper surface of the lower electrode contact structure 123. In example embodiments, the variable resistance structure 140 may cover an entire upper surface of the lower electrode contact structure 123, as shown in FIG. 1. In this case, an upper surface 112a of the second insulating interlayer 112 between a plurality of lower electrode contact structures 123 may be lower along the first direction than a top surface of each of the lower electrode contact structures 123. Also, the upper surface 112a of the second insulating interlayer 112 between the lower electrode contact structures 123 may be higher than an upper surface of the first electrode 117 along the first direction.

In example embodiments, the variable resistance structure 140 may partially cover the upper surface of the lower electrode contact structure 123, as shown in FIG. 2. In this case, the upper surface 112a of the second insulating interlayer 112 between the lower electrode contact structures 123 may be lower than the top surface of each of the lower electrode contact structures 123. Also, the upper surface of the second insulating interlayer 112 between the lower electrode contact structures 123 may be higher than an upper surface of the first electrode 117.

A portion of the lower electrode contact structure 123 under the sidewall of the variable resistance structure 140, e.g., that does not overlap the variable resistance structure 140 along the first direction, may be partially etched. That is, edge portions of the second electrode 120a and the insulation pattern 122a in the lower electrode contact structure 123 may be etched, e.g., may be coplanar with the upper surface 112a of the second insulating interlayer 112 between the lower electrode contact structures 123.

However, the first electrode 117 in the lower electrode contact structure may not be etched, so that the first electrode 117 may have a pillar shape having no etched portion. Thus, the first electrode 117 may be covered by the second insulating interlayer 112, and may not be exposed.

The lower electrode 124a may include a metal, e.g., tungsten, tantalum, titanium, etc., a metal nitride, e.g., tungsten nitride, tantalum nitride, titanium nitride, etc. In example embodiments, a barrier layer may be further formed on the lower electrode 124a.

The MTJ structure 132a may include a first magnetic pattern 126a, a tunnel barrier pattern 128a and a second magnetic pattern 130a sequentially stacked along the first direction.

In example embodiments, the first magnetic pattern 126a may include a fixed pattern, a lower ferromagnetic pattern, an anti-ferromagnetic coupling spacer pattern and an upper ferromagnetic pattern. In this case, the fixed pattern may include, e.g., ferromanganese (FeMn), iridium manganese (IrMn), platinum manganese (PtMn), manganese oxide (MnO), manganese sulfide (MnS), manganese telluride (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), and/or Cr. The lower and upper ferromagnetic patterns may include, e.g., iron (Fe), nickel (Ni), and/or cobalt (Co). The anti-ferromagnetic coupling spacer pattern may include, e.g., ruthenium (Ru), iridium (Ir), and/or rhodium (Rh).

In example embodiments, the second magnetic pattern 130a may serve as a free layer having a changeable magnetization direction. In this case, the second magnetic pattern 130a may include a ferromagnetic material, e.g., Fe, Ni, Co, chromium (Cr), platinum (Pt), etc. The second magnetic pattern 130a may further include. e.g., boron, silicon, etc. The second magnetic pattern 130a may include composite materials including at least two of the ferromagnetic materials. For example, the second magnetic pattern 130a may include, e.g., cobalt iron (CoFe), nickel iron (NiFe), iron chromium (FeCr), cobalt iron nickel (CoFeNi), platinum chromium (PtCr), cobalt chromium platinum (CoCrPt), cobalt iron boron (CoFeB), nickel iron silicon boron (NiFeSiB), cobalt iron silicon boron (CoFeSiB), etc.

The tunnel barrier pattern 128a may be disposed between the first and second magnetic patterns 126a and 130a. Thus, the first and second magnetic patterns 126a and 130a may not be directly connected to each other.

In example embodiments, the tunnel barrier pattern 128a may include a metal oxide having an insulating material, e.g., aluminum oxide or magnesium oxide. In example embodiments, the tunnel barrier pattern 128a may have a thickness of about 5 Å to about 30 Å.

In example embodiments, the free layer may be disposed on the fixed layer, in the MTJ structure 132a. However, embodiments are not limited thereto. In some example embodiments, the free layer may be disposed under the fixed layer, in the MTJ structure 132a.

The upper electrode 134 may include a metal, e.g., tungsten, tantalum, titanium, etc., a metal nitride, e.g., tantalum nitride, titanium nitride, etc. The upper electrode 134 may serve as a hard mask for etching an MTJ layer.

The lower electrode contact structure 123 may include the second electrode 120a having the cylindrical shape. Thus, when an etching process for forming the variable resistance structure 140 is performed, an exposed conductive portion of the lower electrode contact structure 123 may decrease. Also, a conductive by-product generated by etching the lower electrode contact structure 123 may decrease, and thus the re-deposition of the conductive by-product may decrease. If the conductive by-product is re-deposited on a sidewall of the tunnel barrier pattern 128a, an electrical short may be generated between the first and second magnetic patterns 126a and 130a. However, the conductive by-product may decrease because the second electrode 120a has the cylindrical shape, and thus an electrical short of the MTJ structure 132a may decrease.

In example embodiments, a third insulating interlayer may be formed on the second insulating interlayer 112 to cover the variable resistance structure 140. A second wiring structure may extend through the third insulating interlayer, and may contact the upper electrode 134. The second wiring structure may include a barrier layer and a metal layer. The second wiring structure may extend in a direction, and may serve as a bit line.

Figure 8:
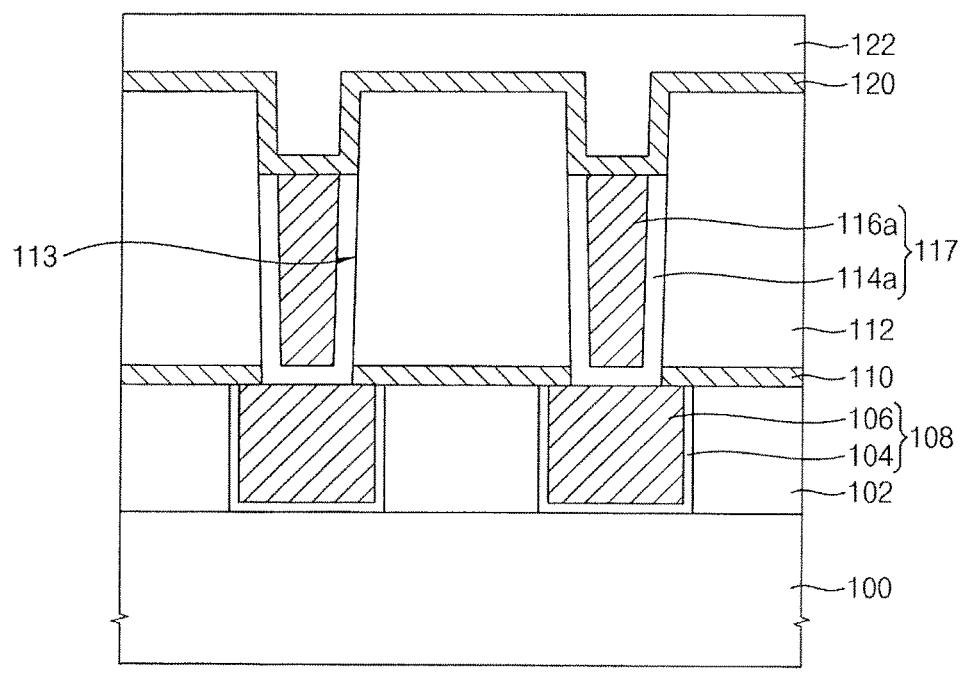
Figure 9:
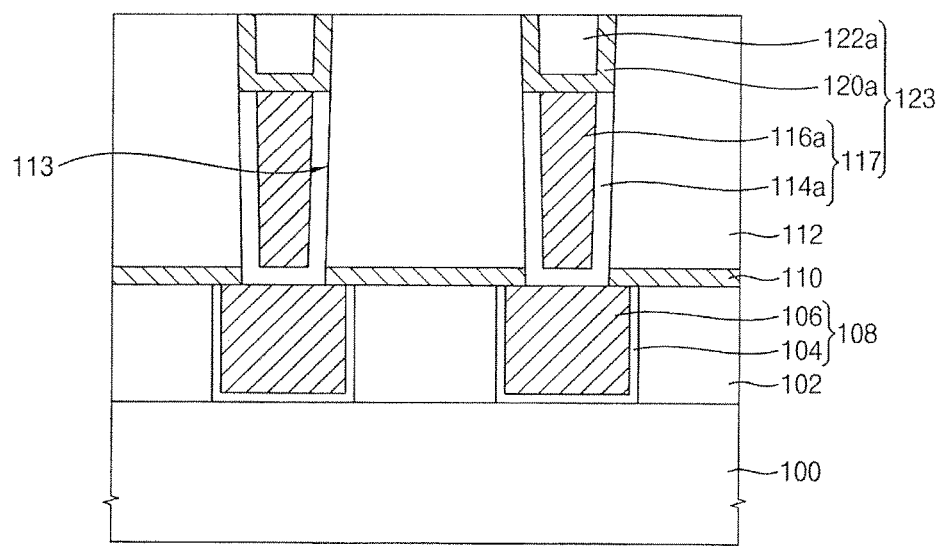
Figure 10:
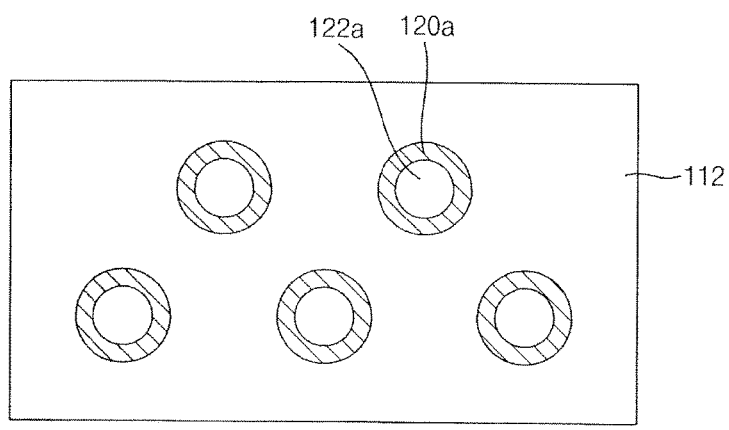

FIGS. 3 to 14 are cross-sectional views and a plan view illustrating stages in a method of manufacturing an MRAM device in accordance with example embodiments. FIGS. 3 to 9 and 11 to 14 are cross-sectional views, and FIG. 10 is a plan view. This method may be used, e.g., for manufacturing the MRAM device shown in FIGS. 1 and 2. Thus, like reference numerals refer to like elements, and detailed descriptions thereon may be omitted below in the interest of brevity.

Figure 3:
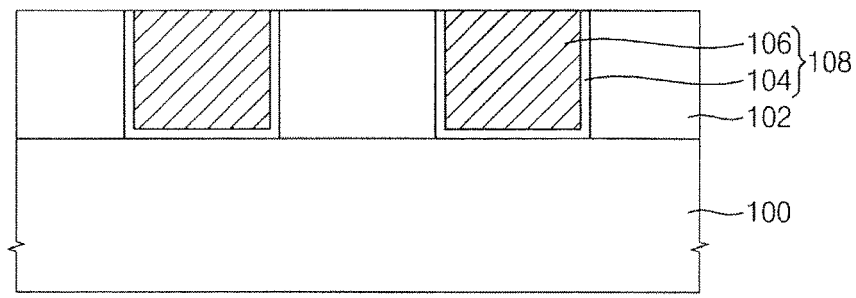
FIGS. 3 to 14 illustrate cross-sectional views and a plan view of stages in a method of manufacturing an MRAM device in accordance with example embodiments.

Referring to FIG. 3, a first insulating interlayer 102 may be formed on a substrate 100, and a first wiring structure 108 may be formed through the first insulating interlayer 102. In example embodiments, the first insulating interlayer 102 may be formed by a chemical vapor deposition (CVD) process, an atomic layer deposition (ALD) process or a spin coating process.

The first wiring structure 108 may include a barrier layer 104 and a metal pattern 106. In example embodiments, the first wiring structure 108 may be formed by a dual damascene process or a single damascene process. In this case, the metal pattern 106 may include, e.g., copper. Alternatively, the first wiring structure 108 may be formed by a photolithography process. In this case, the metal pattern 106 may include, e.g., tungsten, aluminum, etc.

Figure 4:
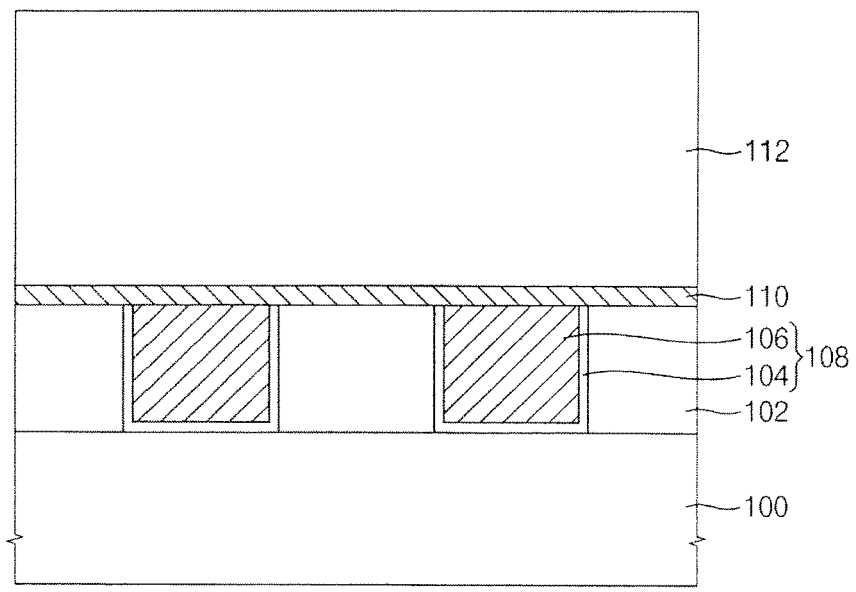

Referring to FIG. 4, an etch stop layer 110 and a second insulating interlayer 112 may be sequentially formed on the first wiring structures 108 and the first insulating interlayer 102. In example embodiments, the etch stop layer 110 may be formed by a CVD process or an ALD process. In example embodiments, the second insulating interlayer 112 may be formed by a CVD process, an ALD process or a spin coating process.

Figure 5:
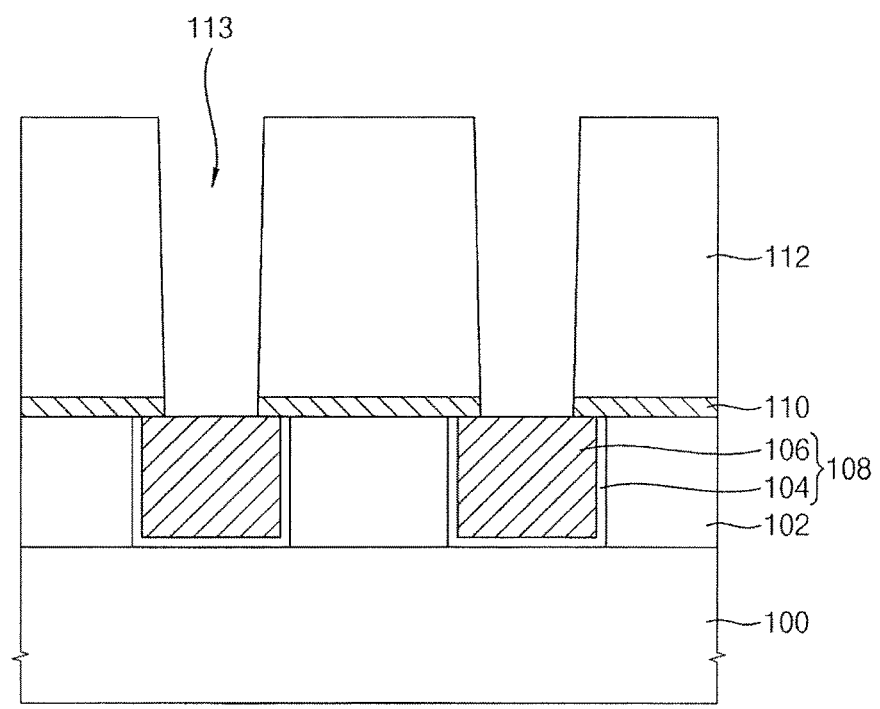

Referring to FIG. 5, the second insulating interlayer 112 and the etch stop layer 110 may be partially etched to form a first opening 113 exposing an upper surface of the first wiring structure 108. In example embodiments, an etching mask may be formed on the second insulating interlayer 112, and the second insulating interlayer 112 and the etch stop layer 110 may be etched by a dry etching process using the etching mask to form the first opening 113.

Figure 6:
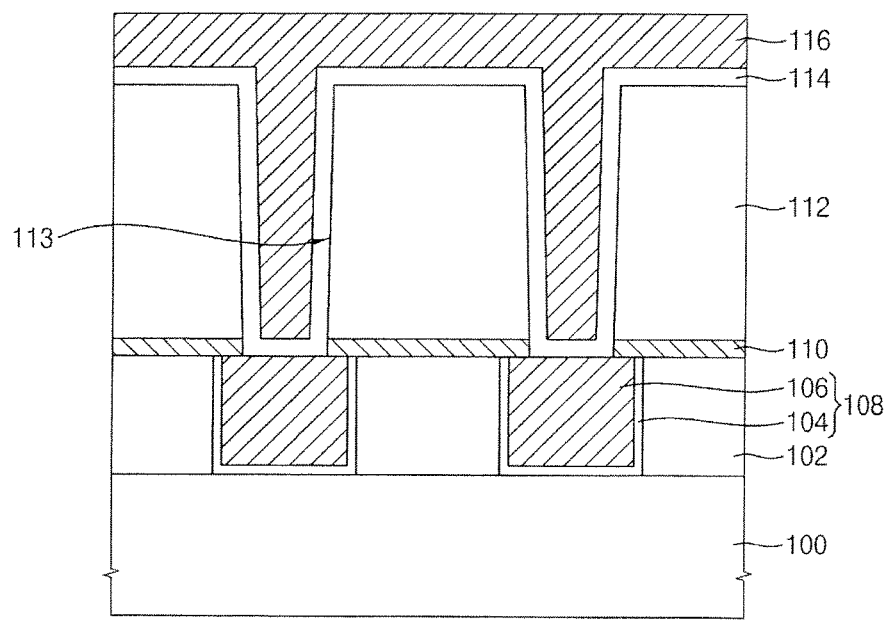

Referring to FIG. 6, a first barrier layer 114 and a first conductive layer 116 may be formed on the second insulating interlayer 112 to fill the first opening 113. The first barrier layer 114 and the first conductive layer 116 may serve as a first electrode 117 (refer to FIG. 7) in a lower electrode contact structure 123 (refer to FIG. 9) subsequently formed.

In example embodiments, the first barrier layer 114 may be conformally formed on a sidewall of the first opening 113 and upper surfaces of the first wiring structure 108 and the second insulating interlayer 112. The first conductive layer 116 may be formed on the first barrier layer 114, and may completely fill the first opening 113. In example embodiments, the first barrier layer 114 and the first conductive layer 116 may be formed by a CVD process or an ALD process.

The first barrier layer 114 may be formed of a metal nitride, e.g., tungsten nitride, tantalum nitride, titanium nitride, etc., and/or a metal, e.g., tantalum, titanium, etc., and the first conductive layer 116 may be formed of a metal having a low resistance, e.g., tungsten, copper, aluminum, etc. For example, the first barrier layer 114 may include tungsten nitride, and the first conductive layer 116 may include tungsten.

Figure 7:
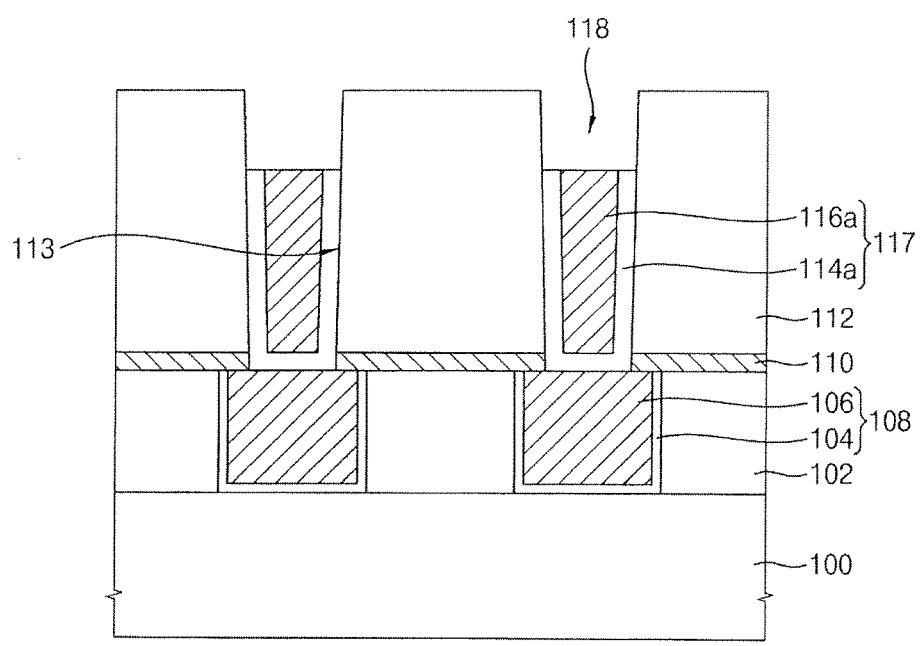

Referring to FIG. 7, the first barrier layer 114 and the first conductive layer 116 on an upper surface of the second insulating layer 112 and in an upper portion of the first opening 113 may be removed to form the first electrode 117 including a first barrier pattern 114a and a first conductive pattern 116a, respectively.

The first electrode 117 may fill a lower portion of the first opening 113, and have a pillar shape. An upper surface of the first electrode 117 may be lower than the upper surface of the second insulating interlayer 112. A space over the first electrode 117 in the first opening 113 is referred to as a second opening 118.

In example embodiments, portions of the first barrier layer 114 and the first conductive layer 116 on the second insulating interlayer may be removed by an etch back process, and then portions of the first barrier layer 114 and the first conductive layer 116 in the upper portion of the first opening 113 may be removed by an etch back process to form the first electrode 117.

Alternatively, portions of the first barrier layer 114 and the first conductive layer 116 on the second insulating interlayer may be removed by an chemical mechanical polishing (CMP) process, and then portions of the first barrier layer 114 and the first conductive layer 116 in the upper portion of the first opening 113 may be removed by an etch back process to form the first electrode 117.

When an ion beam etching (IBE) process is subsequently performed to form a variable resistance structure, the second insulating interlayer 112 and a lower electrode contact structure 123 (refer to FIG. 9) may be partially etched. However, in the IBE process, the first electrode 117 may not be exposed. That is, during the IBE process, the lower electrode contact structure 123 and/or the second insulating interlayer 112 may be etched by a maximum thickness so that the first electrode 117 may not be exposed, and the maximum thickness may be referred to as a first thickness. A height of the upper surface of the first electrode 117 may be lower than a height of a top surface of the lower electrode contact structure 123 after the IBE process, which may correspond to a height reduced by the first thickness from the original height of the top surface of the lower electrode contact structure 123.

In example embodiments, the first conductive pattern 116a may have a resistance lower than that of a second conductive layer 120 (refer to FIG. 8) subsequently formed. Also, a length of the first electrode 117 from a bottom to a top thereof may be greater than a length of the second opening 118 from a bottom to a top thereof, along the first direction, so that a resistance of the lower electrode contact structure 123 may decrease.

Referring to FIG. 8, a second conductive layer 120 may be conformally formed on a sidewall of the second opening 118 and upper surfaces of the second insulating interlayer 112 and the first electrode 117. An insulation layer 122 may be formed on the second conductive layer 120 to fill the second opening 118.

The second conductive layer 120 may include a material different from that of the first conductive pattern 116a. In comparison with the first conductive pattern 116a, the second conductive layer 120 may have a material that may be hardly etched by a physical etching process, e.g., an IBE process and may be hardly re-deposited. The second conductive layer 120 may be formed of a metal nitride, e.g., tungsten nitride, tantalum nitride, titanium nitride, etc., and/or a metal, e.g., tantalum, titanium, etc. The insulation layer 122 may be formed of, e.g., silicon oxide, silicon nitride, etc.

The second conductive layer 120 and the insulation layer 122 may be formed by a CVD process or an ALD process. In example embodiments, the second conductive layer 120 may be formed to have a thickness of about 50 Å to about 150 Å.

Referring to FIGS. 9 and 10, the second conductive layer 120 and the insulation layer 122 may be planarized until an upper surface of the second insulating interlayer 112 may be exposed to form a second electrode 120a and an insulation pattern 122a, respectively, on the first electrode 117. Thus, the first electrode 117, the second electrode 120a and the insulation pattern 122a may form the lower electrode contact structure 123 in the second insulating interlayer 112.

Referring to FIG. 10, the second electrode 120a may have a cylindrical shape, and an upper surface of the second electrode 120a may have a ring shape in a plan view. Thus, an upper surface of the second electrode 120a may have an area less than that of an upper surface of the first electrode 117.

Figure 11:
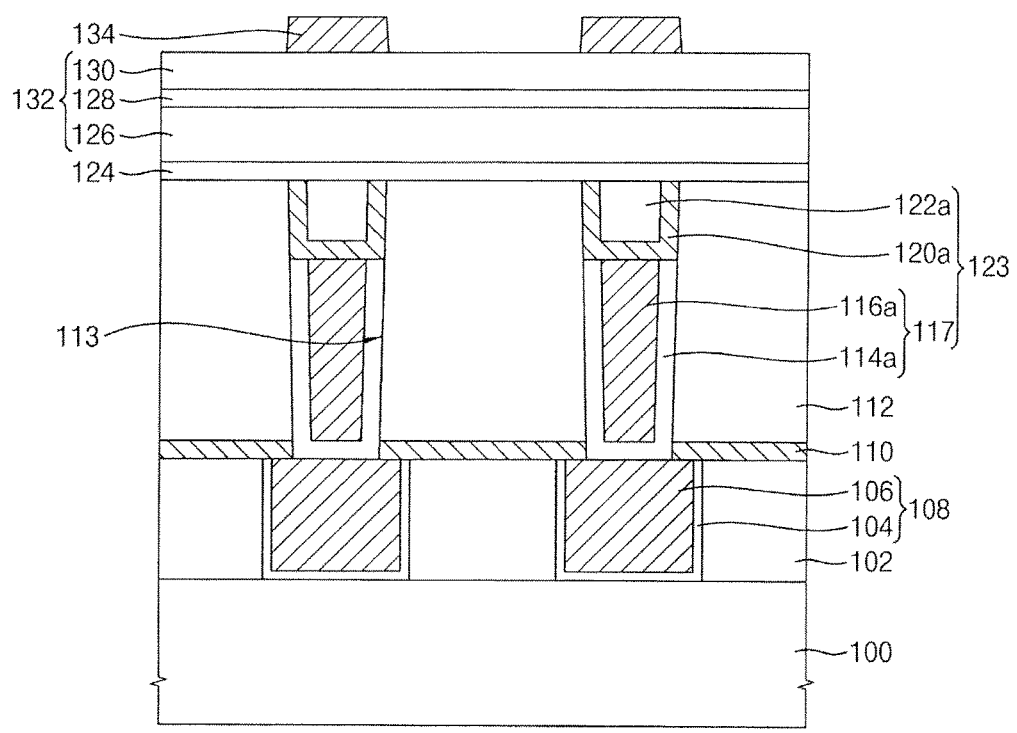
Figure 12:
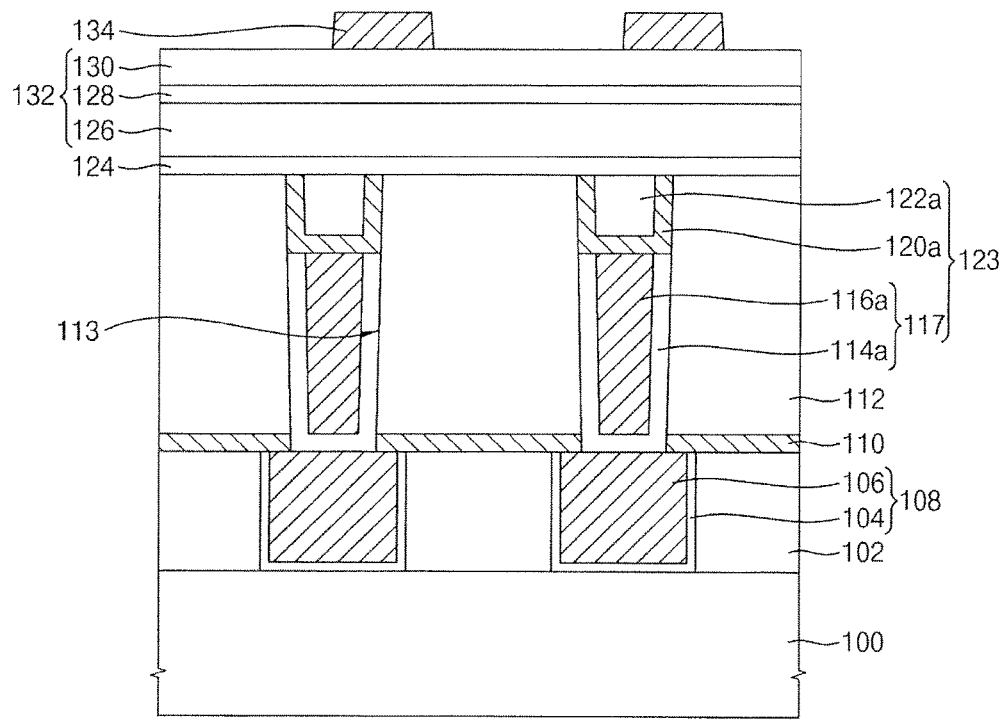

Referring to FIGS. 11 and 12, a lower electrode layer 124, an MTJ layer 132 and an upper electrode layer may be sequentially formed on the second insulating interlayer 112 and the lower electrode contact structure 123. The MTJ layer 132 may include a first magnetic layer 126, a tunnel barrier layer 128 and a second magnetic layer 130 sequentially stacked. In example embodiments, the lower electrode layer 124 may not be formed on the second insulating interlayer 112 and the lower electrode contact structure 123.

The upper electrode layer may be patterned by a photolithography process to form an upper electrode 134. The upper electrode 134 may overlap at least a portion of the lower electrode contact structure 123.

Positions of the upper electrodes 134 shown in FIGS. 11 and 12 may be different from each other. In example embodiments, as shown in FIG. 11, the upper electrode 134 may overlap an entire upper surface of the lower electrode contact structure 123. That is, the upper electrode 134 may be vertically aligned with the lower electrode contact structure 123. In some example embodiments, as shown in FIG. 12, the upper electrode 134 may partially overlap the upper surface of the lower electrode contact structure 123. That is, the upper electrode 134 may be vertically misaligned with the lower electrode contact structure 123.

Figure 13:
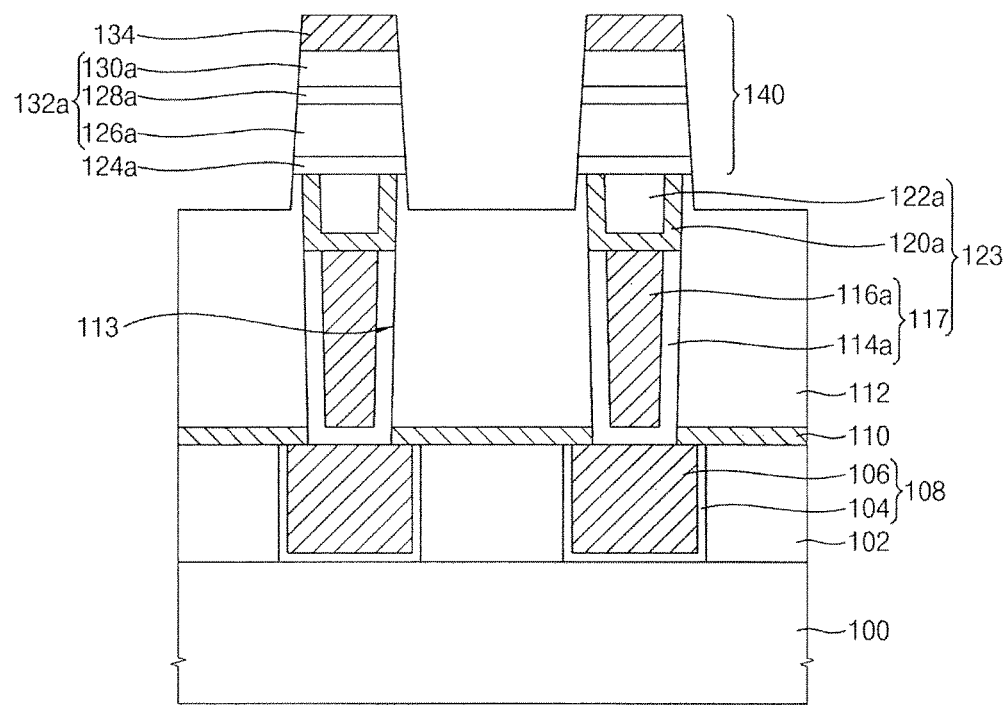
Figure 14:
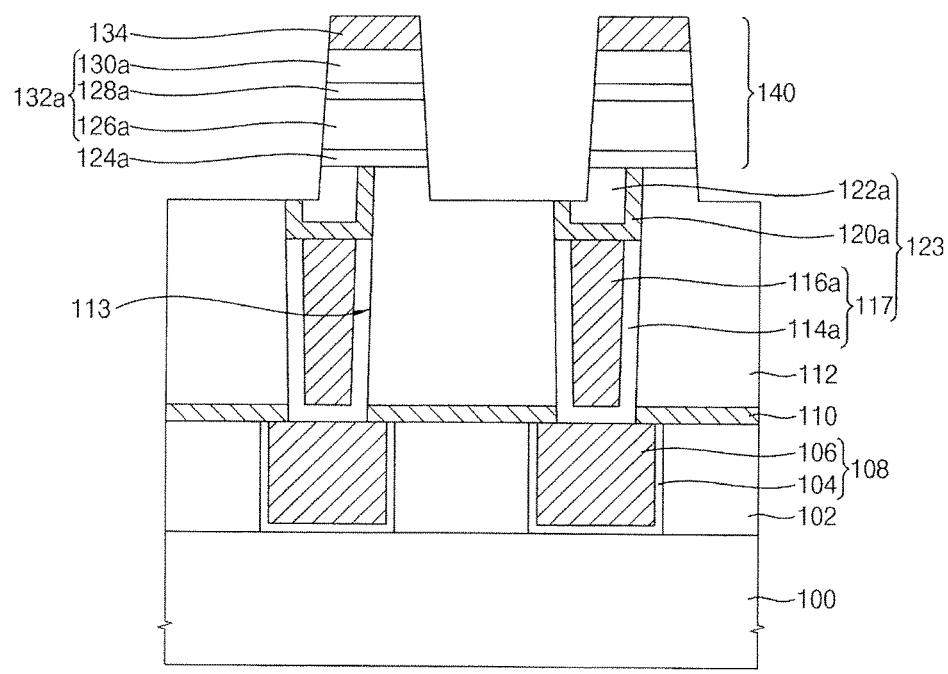

Referring to FIGS. 13 and 14, the second magnetic layer 130, the tunnel barrier layer 128, the first magnetic layer 126, and the lower electrode layer 124 may be sequentially patterned by an etching process using the upper electrode 134 as an etching mask. Thus, the variable resistance structure 140 including a lower electrode 124a, a first magnetic pattern 126a, a tunnel barrier pattern 128a and a second magnetic pattern 130a sequentially stacked may be formed on the lower electrode contact structure 123. A structure including the first magnetic pattern 126a, the tunnel barrier pattern 128a and the second magnetic pattern 130a sequentially stacked may be defined as an MTJ structure 132a.

The first and second magnetic layers 126 and 130 may be formed of a novel metal. Thus, the first and second magnetic layers 126 and 130 may not be easily etched by, e.g., a reactive ion etching (RIE) process. Thus, the first and second magnetic layers 126 and 130 may be etched by a physical etching process, e.g., an IBE process.

FIGS. 13 and 14 show the variable resistance structures 140 according to positions of the upper electrodes 134.

Referring to FIG. 13, when the upper electrode 134 overlaps the entire upper surface of the lower electrode contact structure 123, the variable resistance structure 140 may be formed to cover the entire upper surface of the lower electrode contact structure 123. Thus, during the IBE process, the lower electrode contact structure 123 may not be exposed.

In this case, during the IBE process, an upper portion of the second insulating interlayer 112 between the variable resistance structures 140 may be partially etched. After the IBE process, an upper surface of the second insulating interlayer 112 may be higher than an upper surface of the first electrode 117.

Referring to FIG. 14, when the upper electrode 134 partially covers the upper surface of the lower electrode contact structure 123, the variable resistance structure 140 may be formed to partially cover the upper surface of the lower electrode contact structure 123. Thus, during the IBE process, the lower electrode contact structure 123 may be partially exposed.

In this case, during the IBE process, upper portions of the second insulating interlayer 112 and the lower electrode contact structure 123 between the variable resistance structure 140 may be partially etched. Thus, the second electrode 120a and the insulation pattern 122a in the lower electrode contact structure 123 may be partially etched, but the first electrode 117 may not be etched. That is, after the IBE process, the upper surface 112a of the second insulating interlayer 112 may be higher than the upper surface of the first electrode 117. Thus, the first electrode 117 may be covered by the second insulating interlayer 112, and may not be exposed.

When the variable resistance structure 140 is formed by the IBE process, a sidewall of the lower electrode contact structure 123 may be partially etched. However, in the lower electrode contact structure 123, the second electrode 120a having a cylindrical shape may be partially etched, while the first electrode 117 may not be etched. Thus, the amount of portion of the second electrode 120a etched in the etching process may decrease, so that an electrical short of the MTJ structure 132a due to the re-deposition may decrease.

A third insulating interlayer may be formed on the second insulating interlayer 112 and the variable resistance structure 140. A second wiring structure may be formed on the upper electrode 134 through the third insulating interlayer. The second wiring structure may serve as a bit line. The second wiring structure may be formed by a damascene process.

Figure 15:
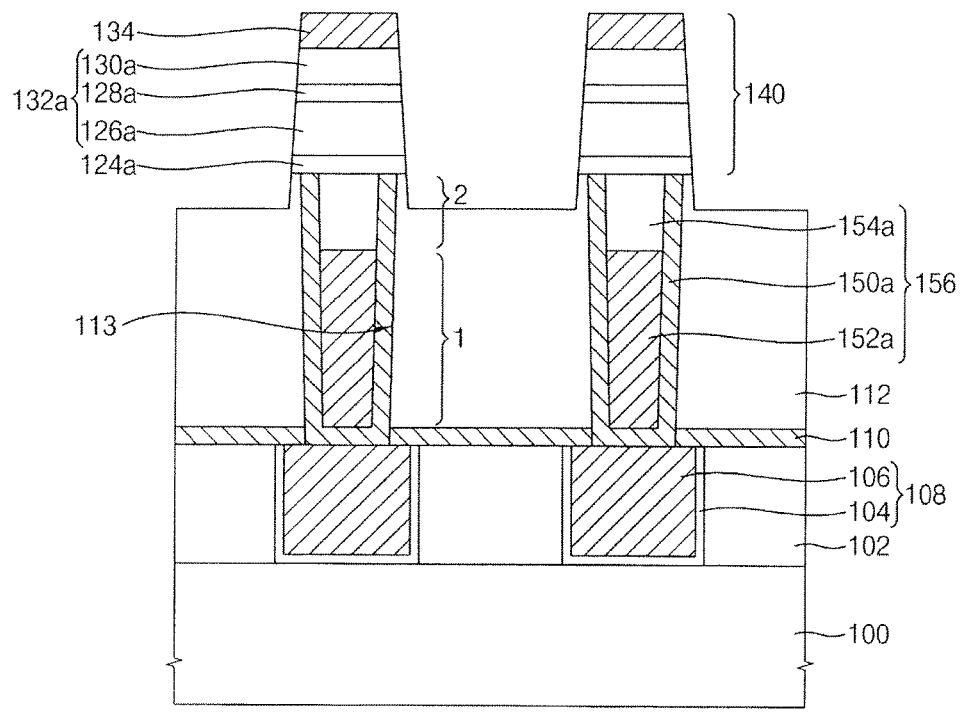
FIG. 15 illustrates a cross-sectional view of an MRAM device in accordance with example embodiments.
Figure 16:
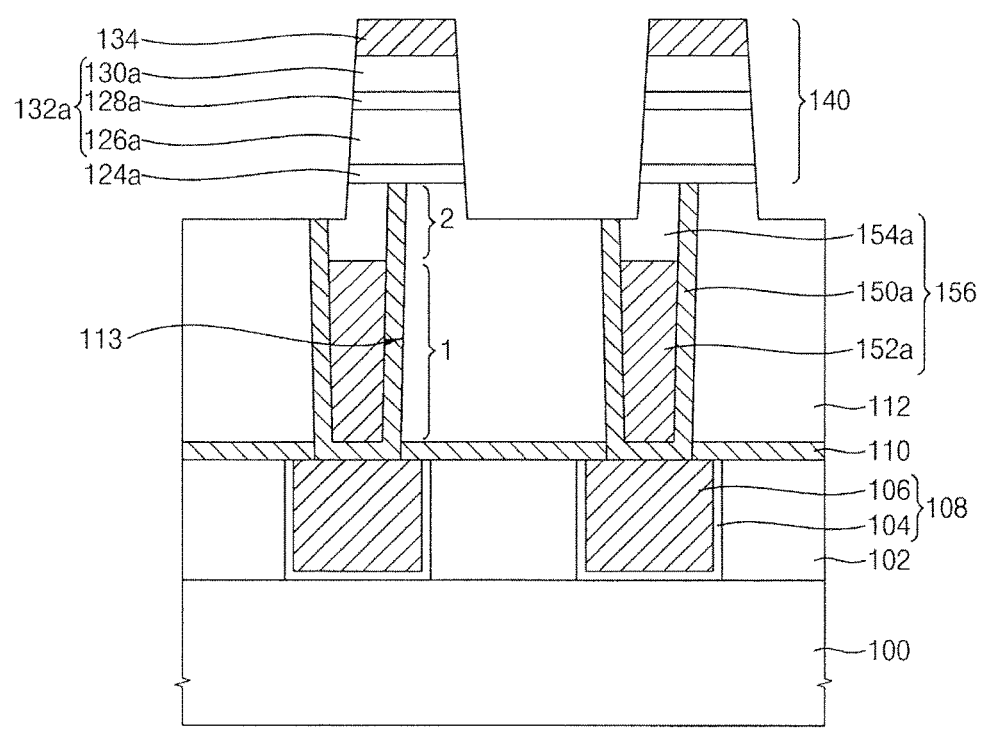
FIG. 16 illustrates a cross-sectional view of an MRAM device in accordance with example embodiments.

FIG. 15 is a cross-sectional view illustrating an MRAM device in accordance with example embodiments. FIG. 16 is a cross-sectional view illustrating an MRAM device in accordance with example embodiments.

The MRAM devices shown in FIGS. 15 and 16 may be substantially the same as the MRAM devices shown in FIGS. 1 and 2, respectively, except for the lower electrode contact structure. Thus, like reference numerals refer to like elements, and detailed descriptions thereon may be omitted below in the interest of brevity.

The MRAM device shown in FIG. 15 may be substantially the same as the MRAM device shown in FIG. 16, except for the position of the variable resistance structure. In the MRAM device shown in FIG. 15, the variable resistance structure may cover an entire upper surface of the lower electrode contact structure. However, in the MRAM device shown in FIG. 16, the variable resistance structure may partially cover the upper surface of the lower electrode contact structure.

Referring to FIGS. 15 and 16, the MRAM device may include the first insulating interlayer 102, the first wiring structure 108, the second insulating interlayer 112, a lower electrode contact structure 156, the lower electrode 124a, the MTJ structure 132a and the upper electrode 134 stacked along the first direction on the substrate 100.

A third insulating interlayer may be further formed on the second insulating interlayer 112 to cover the lower electrode 124a, the MTJ structure 132a, and the upper electrode 134, and a second wiring structure may be further formed through the third insulating interlayer.

The lower electrode contact structure 156 may include a first barrier pattern 150a, a first conductive pattern 152a, and an insulation pattern 154a. The first conductive pattern 152a may fill a lower portion of the first opening 113 in the second insulating interlayer 112. Thus, the first conductive pattern 152a may have a pillar shape, and an upper surface of the first conductive pattern 152a may be lower than an upper surface of the second insulating interlayer 112. The first conductive pattern 152a may include a metal having a lower resistance, e.g., tungsten, copper, aluminum, etc.

The first barrier pattern 150a may be conformally formed on a sidewall and a bottom of the first opening 113. The first barrier pattern 150a may include a first portion 1 covering a sidewall and a bottom of the first conductive pattern 152a and a second portion 2 protruding from the first portion 1.

The first portion 1 of the first barrier pattern 150a may serve as a barrier layer of the first conductive pattern 152a. An upper surface of the second portion 2 of the first barrier pattern 150a may have a ring shape. In particular, the second portion 2 may include an inner space defined by side surfaces of the first barrier pattern 150a that extend along the first direction and an upper surface of the first conductive pattern 152a. The side surfaces of the first barrier pattern 150a may extend further along the second direction than the first conductive pattern 152a and the inner space may overlap the first conductive pattern 152a in the first direction.

Thus, the first portion 1 of the first barrier pattern 150a and the first conductive pattern 152a may correspond to the first electrode 117 of each of the MRAM devices shown in FIGS. 1 and 2. The second portion 2 of the first barrier pattern 150a may correspond to the second electrode 120a of each of the MRAM devices shown in FIGS. 1 and 2.

In example embodiments, the first barrier pattern 150a may include a material different from a material of the first conductive pattern 152a. In comparison with the material of the first conductive pattern 152a, the material of the first barrier pattern 150a may be hardly etched by a physical etching process, e.g., an IBE process, and may be hardly re-deposited. Further, the first barrier pattern 150a may have a high etching selectivity with respect to the first conductive pattern 152a. The first barrier pattern 150a may include a metal nitride, e.g., tungsten nitride, tantalum nitride, titanium nitride, etc., and/or a metal, e.g., tantalum, titanium, etc. For example, the first conductive pattern 152a may include tungsten, and the first barrier pattern 150a may include titanium nitride.

The insulation pattern 154a may be formed on the first barrier pattern 150a and the first conductive pattern 152a, and may fill a remaining portion of the first opening 113. The insulation pattern 154a may directly contact an upper surface of the first conductive pattern 152a. The insulation pattern 154a may include, e.g., silicon nitride, silicon oxynitride, etc., and may prevent a metal of the first conductive pattern 152a from diffusing.

As described above, the lower electrode contact structure 156 may include the first barrier pattern 150a covering a sidewall and a bottom of the first conductive pattern 152a and protruding from the first conductive pattern 152a. Thus, when the variable resistance pattern 140 including the lower electrode 124a, the MTJ structure 132a, and the upper electrode 134 sequentially stacked is formed by the IBE process, a conductive by-product generated by etching the lower electrode contact structure 156 may decrease. Thus, an electrical short of the MTJ structure 132a due to the re-deposition of the conductive by-product may decrease.

FIGS. 17 to 22 are cross-sectional views illustrating stages in a method of manufacturing an MRAM device in accordance with example embodiments. This method of manufacturing the MRAM device may include processes substantially the same as or similar to those illustrated with reference to FIGS. 1 to 14. Thus, like reference numerals refer to like elements, and detailed descriptions thereon may be omitted below in the interest of brevity.

Figure 17:
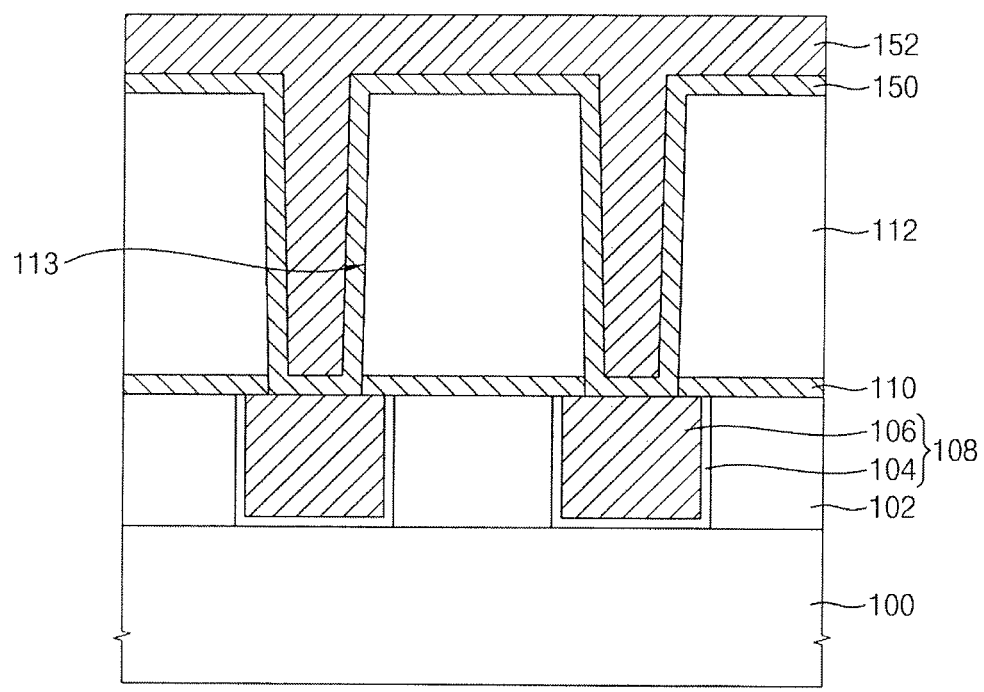
FIGS. 17 to 22 illustrate cross-sectional views of stages in a method of manufacturing an MRAM device in accordance with example embodiments.

Referring to FIG. 17, processes substantially the same as or similar to those illustrated with reference to FIGS. 3 and 5 may be performed. Then, a first barrier layer 150 and a first conductive layer 152 may be formed in the first opening 113. The first barrier layer 150 may be formed of a material having a high etching selectivity with respect to the first conductive layer 152.

The first barrier layer 152 may be formed of a metal nitride, e.g., tantalum nitride, titanium nitride, etc., and/or a metal, e.g., tantalum, titanium, etc. The first conductive layer 152 may be formed of a metal, e.g., tungsten, copper, aluminum, etc. For example, the first barrier layer 150 may be formed of titanium nitride, and the first conductive layer 152 may be formed of tungsten.

Figure 18:
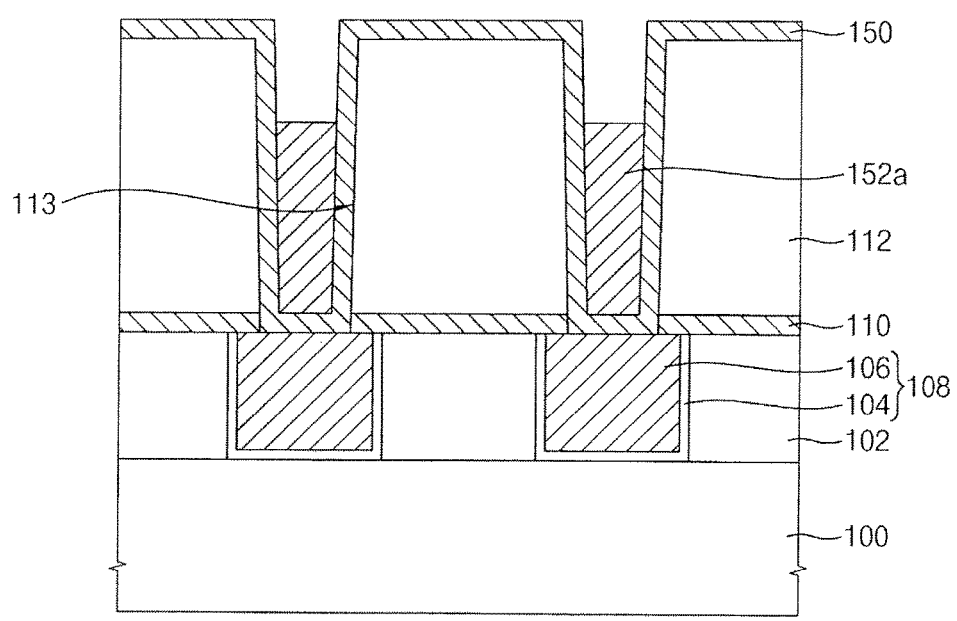

Referring to FIG. 18, portions of the first conductive layer 152 on the second insulating interlayer 112 and in an upper portion of the first opening 113 may be etched to form a first conductive pattern 152a filling in a lower portion of the first opening 113. During the etching process, the first barrier layer 150 may not be etched.

The first conductive pattern 152a may be formed on the first barrier layer 150, and may have a pillar shape. An upper surface of the first conductive pattern 152a may be lower than an upper surface of the second insulating interlayer 112. In example embodiments, the etching process of the first conductive layer 152 may include an etch back process.

When a variable resistance structure 140 (refer to FIG. 21) is subsequently formed by an IBE process, the lower electrode contact structure 156 (refer to FIG. 20) and/or the second insulating interlayer 112 may be etched by a maximum thickness, and the maximum thickness may be referred to as a first thickness. A height of the upper surface of the first conductive pattern 152a may be lower than a height of a top surface of the lower electrode contact structure 156 after the IBE process, which may correspond to a height reduced by the first thickness from the original height of the top surface of the lower electrode contact structure 156.

Figure 19:
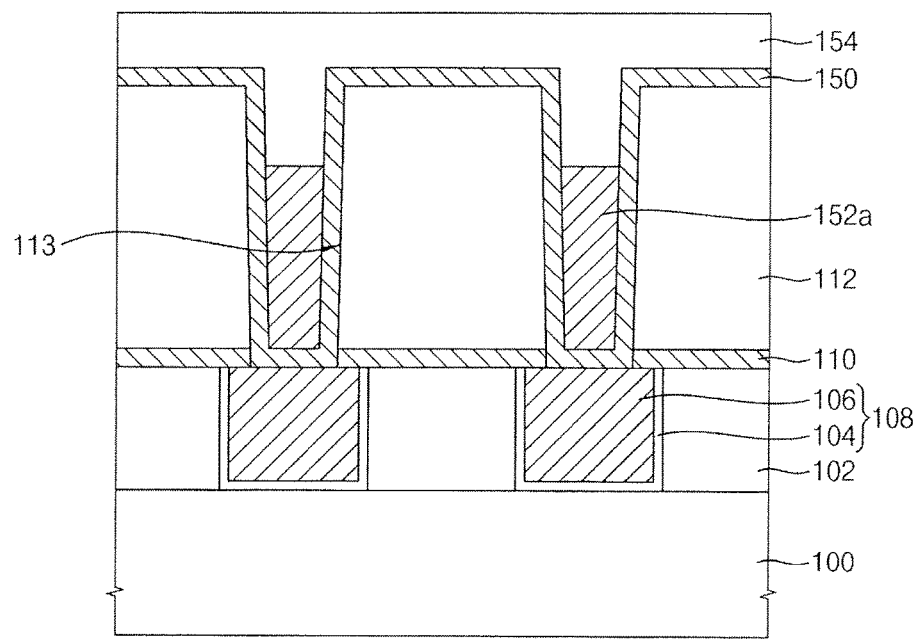

Referring to FIG. 19, an insulation layer 154 may be formed on the first barrier layer 150 and the first conductive pattern 152a to fill a remaining portion of the first opening 113. The insulation layer 154 may be formed of, e.g., silicon nitride, silicon oxynitride, etc., by a CVD process or an ALD process.

Figure 20:
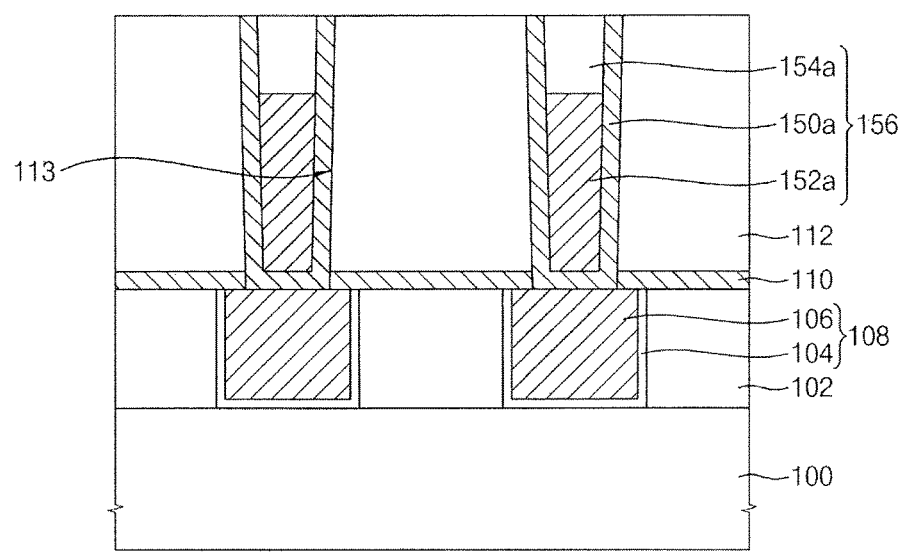

Referring to FIG. 20, the first barrier layer 150 and the insulation layer 154 may be planarized until an upper surface of the second insulating interlayer 112 may be exposed to form a first barrier pattern 150a and an insulation pattern 154a, respectively. Thus, the lower electrode contact structure 156 including the first barrier pattern 150a, a first conductive pattern 152a and an insulation pattern 154a may be formed through the second insulating interlayer 112. A first barrier pattern 150a may be exposed, and an upper surface of the first barrier pattern 150a may have a ring shape.

Figure 21:
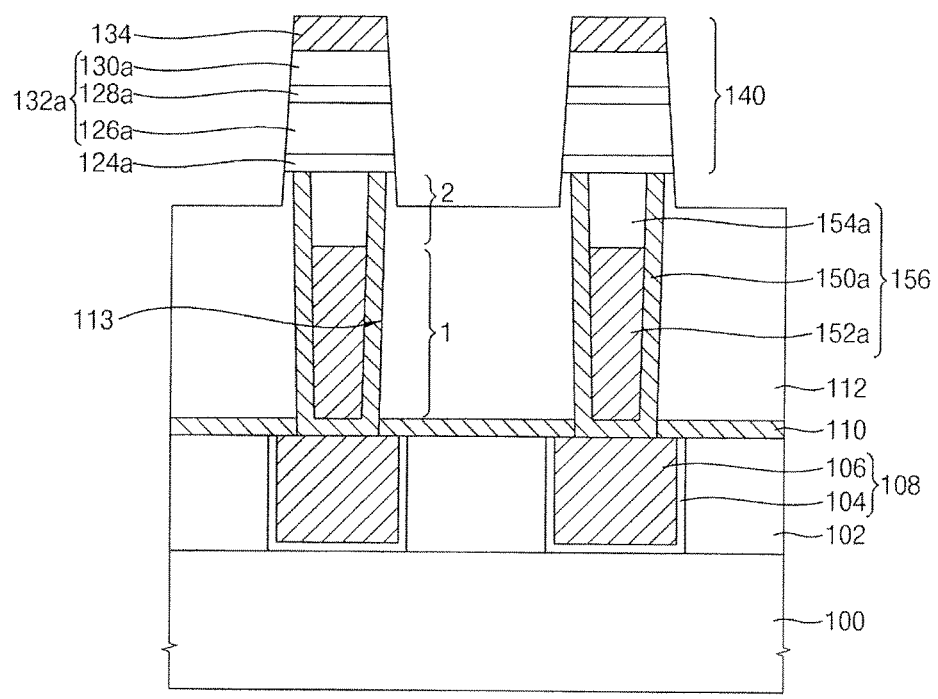
Figure 22:
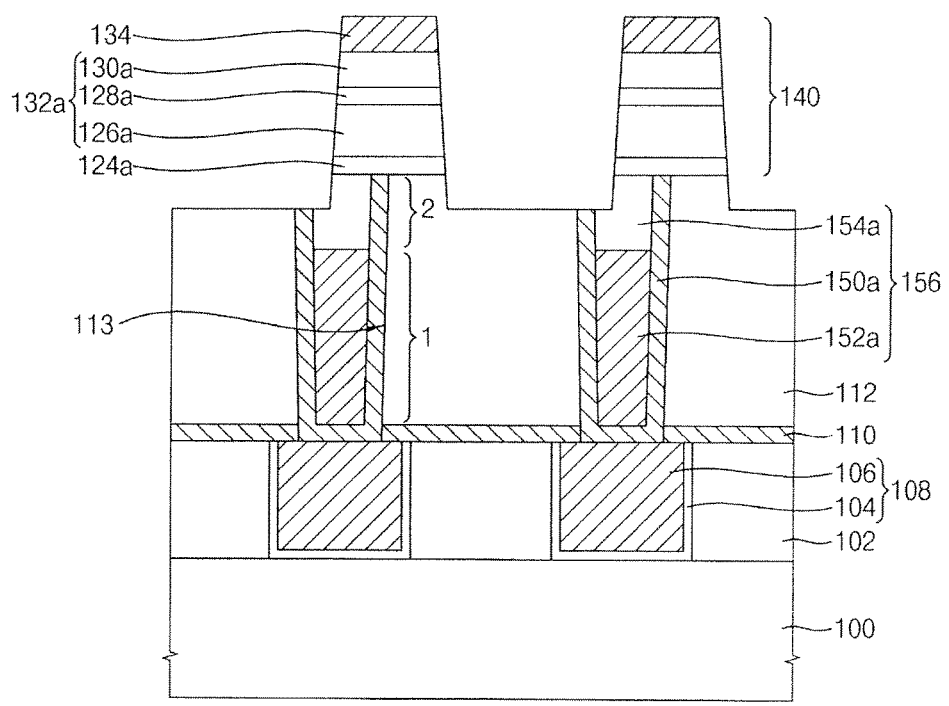

Then, processes substantially the same as or similar to those illustrated with reference to FIGS. 11 and 13 may be performed to manufacture the MRAM shown in FIG. 21. Alternatively, processes substantially the same as or similar to those illustrated with reference to FIGS. 12 and 14 may be performed to manufacture the MRAM shown in FIG. 22.

Figure 23:
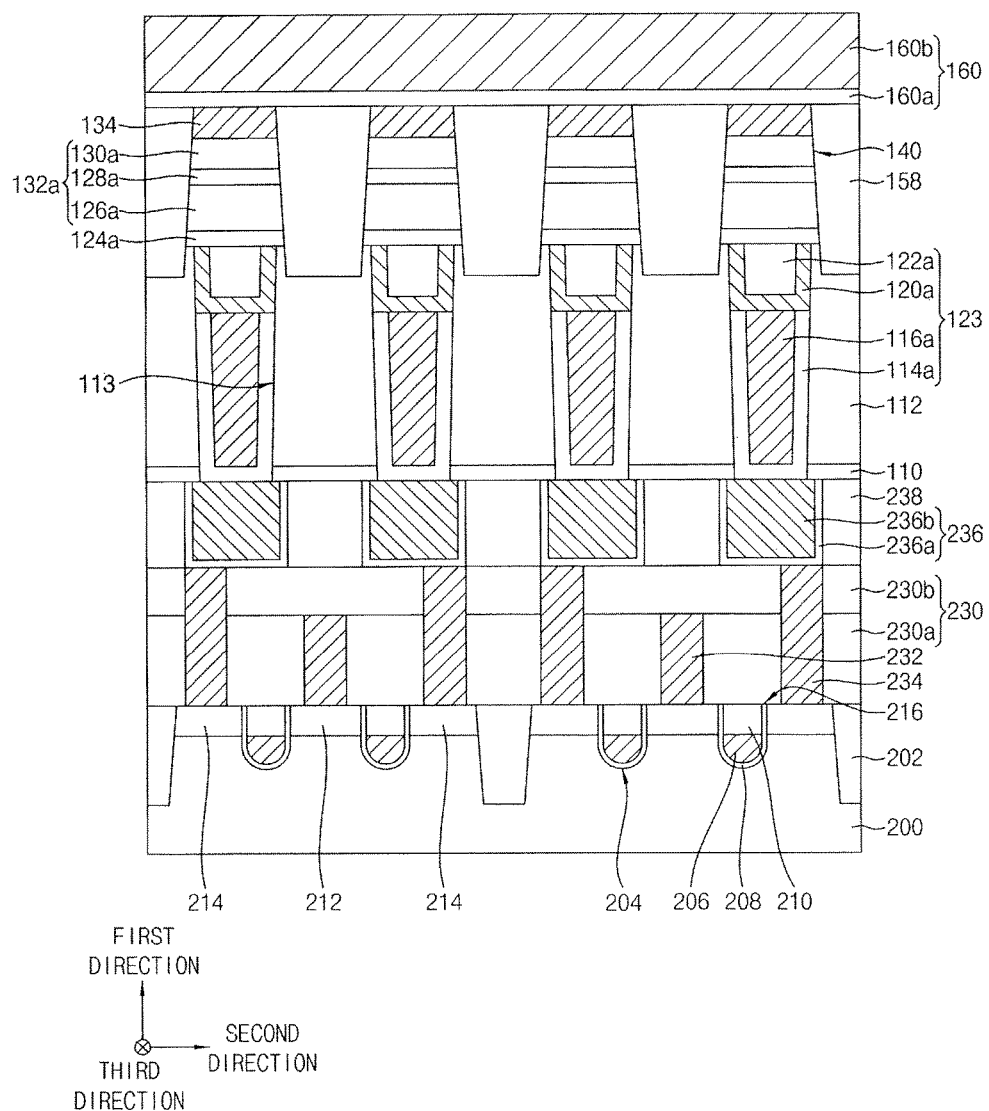
FIG. 23 illustrates a cross-sectional view of an MRAM device in accordance with example embodiments.

FIG. 23 is a cross-sectional view illustrating an MRAM device in accordance with example embodiments. Referring to FIG. 23, a substrate 200 may include an active region and a field region. A transistor 216 may be formed on the active region in the substrate 200. In example embodiments, the transistor 216 may include a gate structure filling a trench formed on the substrate 200. That is, the transistor 216 may be a buried channel array transistor. The gate structure may include a gate insulation pattern 206, a gate electrode 208 and a hard mask 210. The gate structure may extend in a third direction. Alternatively, the transistor 216 may be a planar transistor.

A plurality of active regions may be spaced apart from each other, and may be regularly arranged. In example embodiments, two transistors 216 including two gate structures and source/drain regions may be formed on each of the active regions. A common source region 212 may be formed at a center of the active region, and drain regions 214 may be formed at edge portions of the active region.

A source line 232 may contact the source region 212, and may extend in the third direction. The source line 232 may include or a metal, e.g., tungsten, tantalum, titanium, etc., or a metal nitride, e.g., tungsten nitride, tantalum nitride, titanium nitride, etc. A lower insulating interlayer 230 may be formed on the substrate 200. The lower insulating interlayer 230 may cover the source line 232 and the transistor 216.

A contact plug 234 may extend along the first direction through the lower insulating interlayer 230, and may contact each of the drain regions 214. A first wiring structure 236 may be formed on the contact plug 234. A first insulating interlayer 238 may be formed between a plurality of first wiring structures 236. In example embodiments, the first wiring structure 236 and the first insulating interlayer 238 may be substantially the same as the first wiring structure 108 and the first insulating interlayer 102, respectively, illustrated with reference to FIGS. 1 and 2.

The etch stop layer 110 and the second insulating interlayer 112 may be formed on the first wiring structure 236. The lower electrode contact structure 123 may be formed through the etch stop layer 110 and the second insulating interlayer 112 on the first wiring structure 236. The lower electrode 124a, the MTJ structure 132a and the upper electrode 134 may be formed on the lower electrode contact structure 123.

In example embodiments, the etch stop layer 110, the second insulating interlayer 112, the lower electrode contact structure 123, the lower electrode 124a, the MTJ structure 132a, and the upper electrode 134 may be substantially the same as those, respectively, illustrated with reference to FIG. 1. Alternatively, the etch stop layer 110, the second insulating interlayer 112, the lower electrode contact structure 123, the lower electrode 124a, the MTJ structure 132a, and the upper electrode 134 may be substantially the same as those, respectively, illustrated with reference to FIG. 2.

A third insulating interlayer 158 may be formed on the second insulating interlayer 112 to cover the variable resistance structure 140 including the lower electrode 124a, the MTJ structure 132a, and the upper electrode 134 sequentially stacked along the first direction. The third insulating interlayer 158 may include, e.g., silicon oxide.

A bit line 160 may be formed through the third insulating interlayer 158 on the variable resistance structure 140. The bit line 160 may contact a plurality of upper electrodes 134, and may extend in a second direction substantially perpendicular to the third direction. A plurality of bit lines 160 may be parallel with each other.

The bit line 160 may include a barrier pattern 160a and a metal pattern 160b. The barrier pattern 160a may include a metal, e.g., tantalum, titanium, etc., or a metal nitride, e.g., tantalum nitride, titanium nitride, etc. The metal pattern may include a metal, e.g., copper, tungsten, aluminum, etc. An upper insulating interlayer may be formed on the third insulating interlayer 158 and the bit line 160.

FIGS. 24 to 27 are cross-sectional views illustrating stages in a method of manufacturing an MRAM device in accordance with example embodiments.

Figure 24:
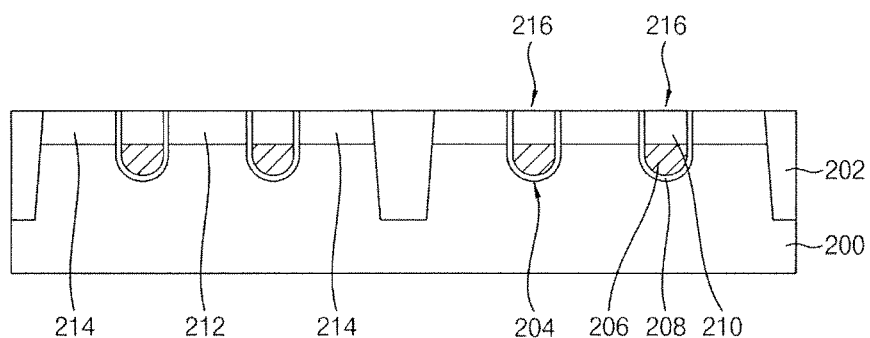
FIGS. 24 to 27 illustrate cross-sectional views of stages in a method of manufacturing an MRAM device in accordance with example embodiments.

Referring to FIG. 24, an isolation layer 202 may be formed on a substrate 200, and thus an active region and a field region may be defined in the substrate 200. The isolation layer 202 may be formed by a shallow trench isolation (STI) process. A plurality of active regions may be spaced apart from each other, and may be regularly arranged. A plurality of transistors 216 may be formed on the substrate 200.

In example embodiments, a mask may be formed on the substrate 200. The substrate 200 may be etched using the mask to form a plurality of trenches 204 extending in the third direction. Each of the active regions may include two trenches 204 thereon. A gate structure may be formed to fill each of the trenches 204, and the gate structure may include a gate insulation pattern 206, a gate electrode 208, and a hard mask 210 sequentially stacked. Impurities may be doped into the active region adjacent the gate structure to form a source region 212 and a drain region 214. The source region 212 may be commonly used in adjacent two transistors.

Figure 25:
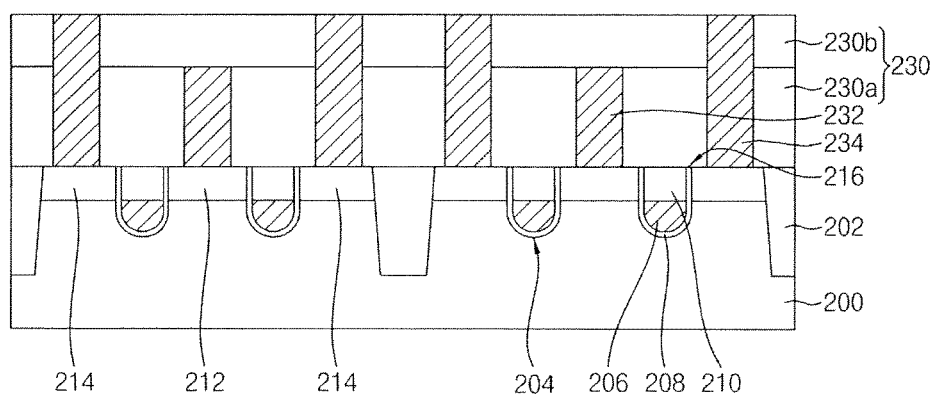

Referring to FIG. 25, a first lower insulating interlayer 230a may be formed on the substrate 200. The first lower insulating interlayer 230a may be partially etched to form an opening exposing the source region 212. A conductive layer may be formed to fill the opening, and the conductive layer may be planarized to form a source line 232 contacting the source region 212.

A second lower insulating interlayer 230b may be formed on the first lower insulating interlayer 230a and the source line 232. The first and second lower insulating interlayers 230a and 230b may form a lower insulating interlayer 230.

An opening exposing the drain region 214 may be formed through the lower insulating interlayer 230. A second conductive layer may be formed to fill the opening, and the second conductive layer may be planarized to form a contact plug 234 contacting the drain region 214.

Figure 26:
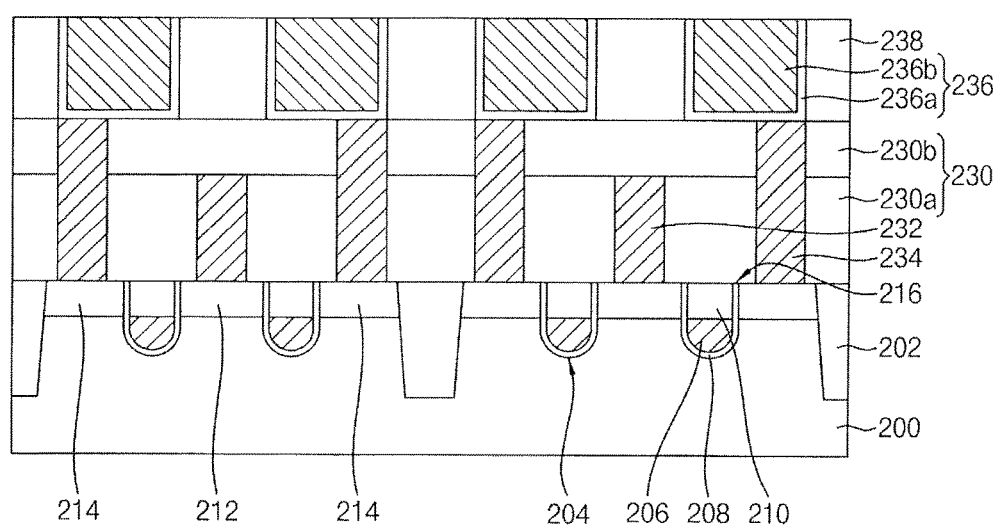

Referring to FIG. 26, a first insulating interlayer 238 may be formed on the lower insulating interlayer 230. A first wiring structure 236 may be formed on the contact plug 234 through the first insulating interlayer 238. The first wiring structure 236 may be formed by processes substantially the same as or similar to those illustrated with reference to FIG. 3.

Figure 27:
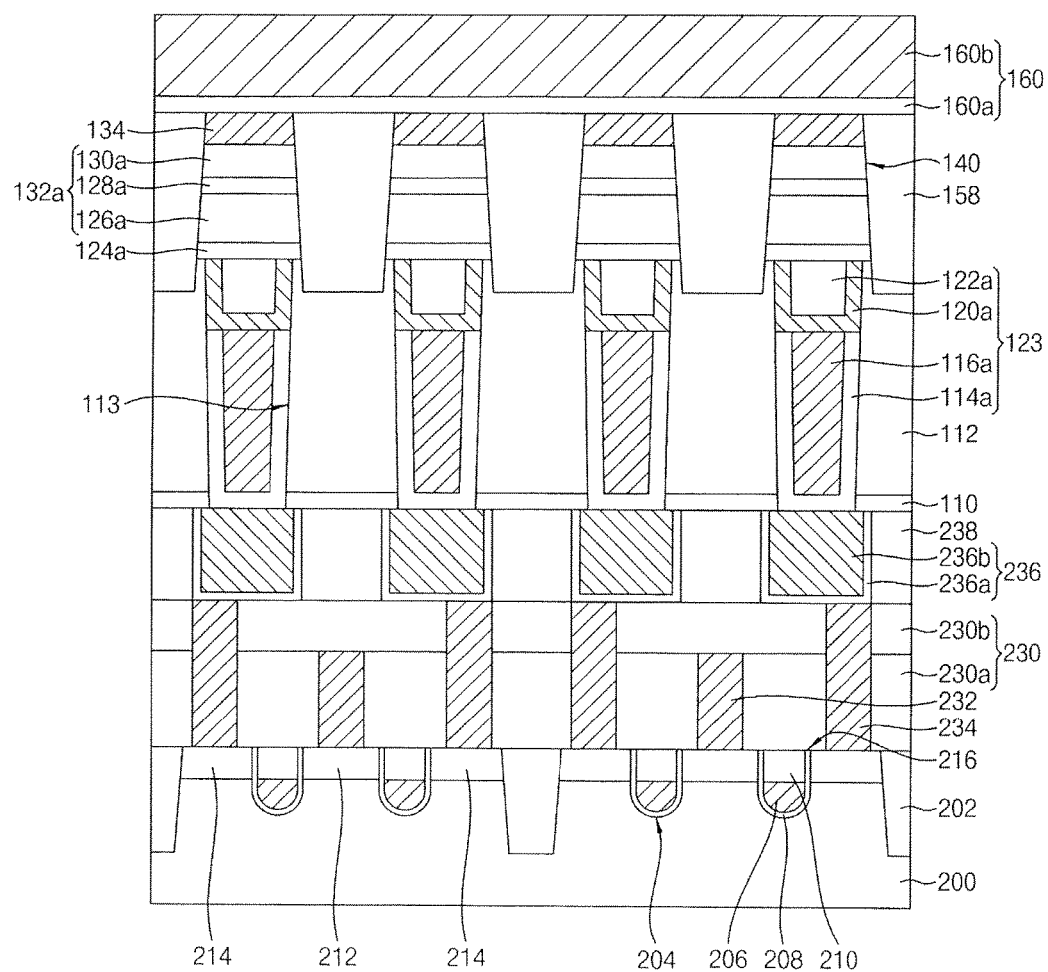

Referring to FIG. 27, processes substantially the same as or similar to those illustrated with reference to FIGS. 4 to 11 and 13. Thus, as shown in FIG. 13, the etch stop layer 110, the second insulating interlayer 112, the lower electrode contact structure 123, the lower electrode 124a, the MTJ structure 132a and the upper electrode 134 may be formed on the first insulating interlayer 238 and the first wiring structure 236.

A third insulating interlayer 158 may be formed on the second insulating interlayer 112 to cover the variable resistance structure 140 including the lower electrode 124a, the MTJ structure 132a and the upper electrode 134 sequentially stacked. In example embodiments, the third insulating interlayer 158 may be further planarized, so that an upper surface of the third insulating interlayer 158 may be flat. The third insulating interlayer 158 may be etched to form a trench for forming a bit line 160. The trench may extend in the second direction. The upper electrode 134 may be exposed by the trench.

The bit line 160 may be formed to fill the trench. The bit line 160 may be formed by forming a barrier layer on the sidewall and the lower surface of the trench, forming a metal layer on the barrier layer to fill the trench and planarizing the metal layer and the barrier layer. The bit line 160 may include a barrier pattern 160*a* and a metal pattern 160*b*, and may contact the upper electrode 134. Then, an upper insulating interlayer may be further formed on the third insulating interlayer 158 and the bit line 160.

When the variable resistance structure 140 is formed by the IBE process, the re-deposition of the conductive by-product may decrease. Thus, an electrical short of the MTJ structure may decrease.

Figure 28:
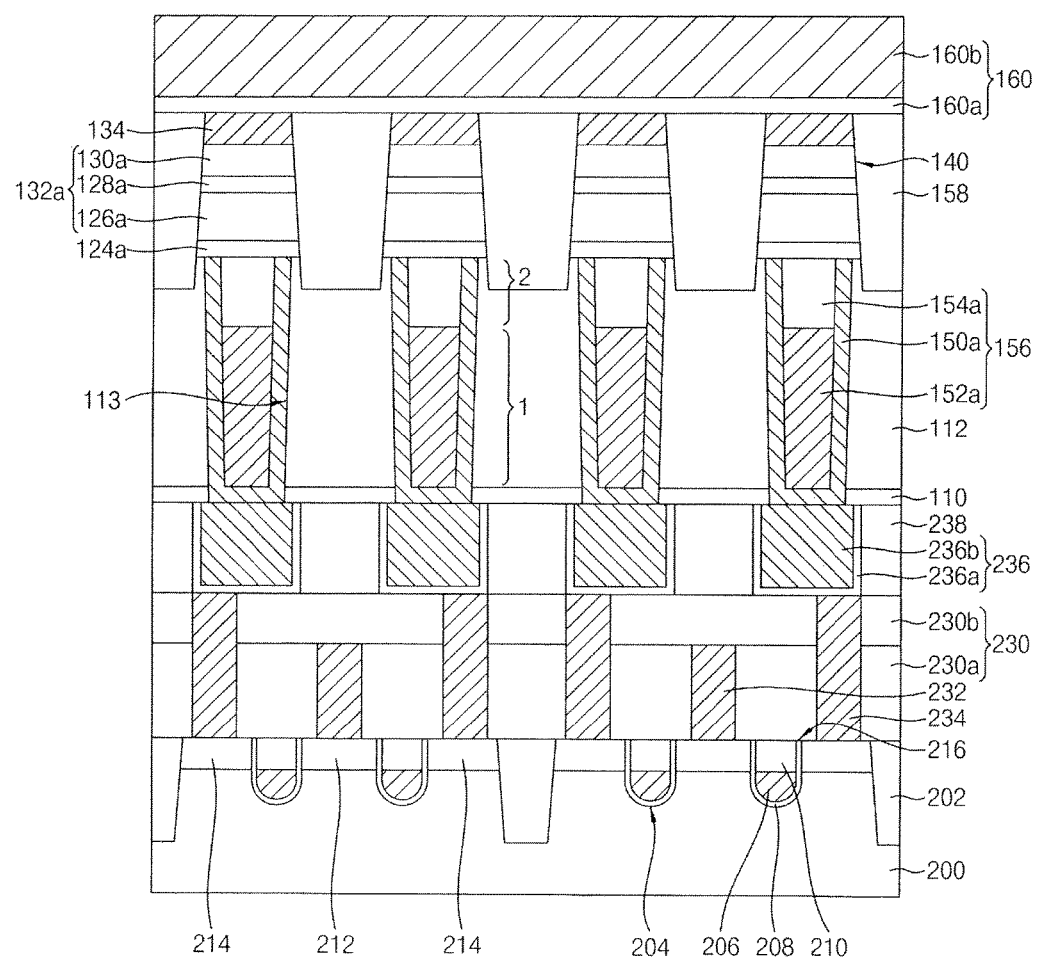
FIG. 28 illustrates a cross-sectional view of a stage in a method of manufacturing an MRAM device in accordance with example embodiments.

FIG. 28 is a cross-sectional view illustrating an MRAM device in accordance with example embodiments. Referring to FIG. 28, the transistor 216, the source line 232, the contact plug 234, the first insulating interlayer 238 and the first wiring structure 236 may be formed on the substrate 200. The transistor 216, the source line 232, the contact plug 234, the first insulating interlayer 238 and the first wiring structure 236 may be substantially the same as those, respectively, illustrated with reference to FIG. 23.

The second insulating interlayer 112, the lower electrode contact structure 156, the lower electrode 124*a*, the MTJ structure 132*a* and the upper electrode 134 substantially the same as those, respectively, illustrated with reference to FIG. 15 may be formed on the first insulating interlayer 238 and the first wiring structure 236.

Alternatively, the second insulating interlayer 112, the lower electrode contact structure 156, the lower electrode 124*a*, the MTJ structure 132*a* and the upper electrode 134 substantially the same as those, respectively, illustrated with reference to FIG. 16 may be formed on the first insulating interlayer 238 and the first wiring structure 236. The third insulating interlayer 158 and the bit line 160 substantially the same as those, respectively, illustrated with reference to FIG. 23 may be formed on the second insulating interlayer 112.

By way of summation and review, in the MRAM device in accordance with example embodiments, an electrical short due to a conductive by-product may decrease, and a resistance of the lower electrode contact structure may decrease. Thus, the MRAM device may have good characteristics.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetoresistive random access memory (MRAM) device, comprising:
   an insulating interlayer on a substrate, the insulating interlayer including an opening therethrough;
   a first electrode in a lower portion of the opening, the first electrode having a pillar shape;
   a second electrode on a sidewall of the opening, the second electrode contacting an edge portion of the first electrode and vertically protruding from an upper surface of the first electrode, and an upper surface of the second electrode having a ring shape;
   an insulation pattern on the second electrode, the insulation pattern filling an upper portion of the opening; and
   a variable resistance structure on the second electrode and the insulation pattern, the variable resistance structure including a lower electrode, a magnetic tunnel junction (MTJ) structure, and an upper electrode sequentially stacked, wherein
   the variable resistance structure includes a plurality of variable resistance structures,
   an upper surface of the insulating interlayer between the plurality of variable resistance structures is lower than the upper surface of the second electrode, and is higher than the upper surface of the first electrode, and
   an upper surface of the insulating interlayer under the variable resistance structure is higher than the upper surface of the insulating interlayer between the plurality of variable resistance structures.

2. The MRAM device as claimed in claim 1, wherein the first electrode includes a conductive material different from a conductive material of the second electrode.

3. The MRAM device as claimed in claim 1, wherein the first electrode includes tungsten, copper or aluminum.

4. The MRAM device as claimed in claim 1, wherein the second electrode includes tantalum, titanium, tantalum nitride, titanium nitride, and/or tungsten nitride.

5. The MRAM device as claimed in claim 1, wherein a length of the first electrode from a bottom to a top thereof is greater than a length of a portion of the second electrode protruding from the upper surface of the first electrode.

6. The MRAM device as claimed in claim 1, wherein the second electrode is formed on an upper sidewall of the opening and the upper surface of the first electrode, and has a cylindrical shape.

7. The MRAM device as claimed in claim 1, further comprising a barrier pattern covering a sidewall and a bottom of the first electrode.

8. The MRAM device as claimed in claim 1, wherein the second electrode covers a sidewall and a bottom of the first electrode and protrudes from the upper surface of the first electrode, and the insulation pattern directly contacts the first electrode.

* * * * *